United States Patent
Kiely et al.

[11] Patent Number: 6,160,830
[45] Date of Patent: Dec. 12, 2000

[54] SEMICONDUCTOR LASER DEVICE AND METHOD OF MANUFACTURE

[75] Inventors: Philip Anthony Kiely; Paul Robert Claisse; Jamal Ramdani, all of Gilbert, Ariz.

[73] Assignee: Motorola, Inc., Schaumburg, Ill.

[21] Appl. No.: 09/034,279

[22] Filed: Mar. 4, 1998

[51] Int. Cl.$^7$ ................................................. H01S 3/19
[52] U.S. Cl. ................................................. 372/46
[58] Field of Search ........................... 372/46, 96; 438/22

[56] References Cited

U.S. PATENT DOCUMENTS

| | | | |
|---|---|---|---|
| 5,706,306 | 1/1998 | Jiang | 372/96 |
| 5,719,893 | 2/1998 | Jiang | 372/45 |
| 5,914,973 | 6/1999 | Jiang | 372/36 |
| 5,956,364 | 9/1999 | Jiang | 372/96 |
| 5,966,399 | 10/1999 | Jiang | 372/96 |

OTHER PUBLICATIONS

"Effects of Lateral Mode and Carrier Density Profile on Dynamic Behaviors of Semiconductor Lasers" by Naoki Chinone, K. Aiki, M. Nakamura and R. Ito, IEEE Journal of Quantum Electronics, vol. QE14, No. 8, Aug. 1978.

"Singlemode emmission from a passive–antiguide–region vertical cavity surface–emitting laser" by Y.A. Wu, C.J. Chang–Hasnain and R. Nabiev, Electronic Letters, vol. 29, No. 21, 14th Oct. 1993.

"Low threshold buried heterostructure vertical cavity surface emitting laser" by C.J. Chang–Hasnain, Y.A. Wu and G.S. Li, Appl. Phys,. Lett., vol. 63, No. 10, Sep. 6, 1993.

*Primary Examiner*—Teresa M. Arroyo
*Assistant Examiner*—Gioacchino Inzirillo
*Attorney, Agent, or Firm*—Anthony M. Martinez

[57] ABSTRACT

A Vertical Cavity Surface Emitting Laser (VCSEL) (10) and a method for manufacturing the VCSEL (10). The VCSEL (10) includes a ridge structure (34), a first confinement layer (36) disposed adjacent to a portion of the ridge structure (34), and a second confinement layer (37) disposed on the first confinement layer (36) and disposed adjacent to a portion of the ridge structure (32). Carriers injected into the ridge structure (34) are confined by the first confinement layer (36).

11 Claims, 2 Drawing Sheets

SEMICONDUCTOR LASER DEVICE AND METHOD OF MANUFACTURE

BACKGROUND OF THE INVENTION

The present invention relates, in general, to lasers and, more particularly, to Vertical Cavity Surface Emitting Lasers (VCSELs).

Semiconductor lasers such as VCSELs are used to generate an optical signal, e.g., light, in optical communication systems, Compact Disc (CD) players, bar code scanners, etc. Typically, a VCSEL in forward bias will not lase over all the area which is being electrically pumped, either due to high loss edge regions or because of the optical mode profile which is being supported. The intensity of the optical signal generated by the VCSEL is dependent on the amount of current flowing in the active region, i.e., the larger the current, the greater the intensity of the optical signal.

A potential problem with VCSELs is the generation of a secondary or undesirable optical signal (also referred to as an optical tail) upon removal of the electrical input signal. Secondary optical signals result because some areas within the VCSEL have a greater carrier density than other areas within the VCSEL, i.e., the carrier distribution within the VCSEL is non-uniform. More particularly, the carrier density is greater in the areas of the VCSEL that are not lasing than in the areas of the VCSEL that are lasing. When the electrical input signal is removed, carriers from the higher carrier density portions diffuse towards the lower carrier density portions of the VCSEL and can result in these portions being able to lase again, leading to a secondary output signal. This signal can reach levels as high as 20 percent of the maximum amplitude of the primary optical output signal. Secondary optical output signals can reduce system performance and result in the transfer of erroneous data.

Accordingly, it would be advantageous to have a laser device and method for preventing secondary optical output pulses. It would be of further advantage for the laser device and method to be compatible with standard semiconductor processes and be cost efficient.

DETAILED DESCRIPTION OF THE DRAWINGS

Generally, the present invention provides a semiconductor device such as a semiconductor laser device and a method for manufacturing the semiconductor laser device. More particularly, the present invention provides a Vertical Cavity Surface Emitting Laser (VCSEL) having reduced secondary optical output signals and a method for manufacturing the VCSEL. The present invention provides a VCSEL in which the injection current, i.e., the injected carriers, are confined within the lasing mode of the VCSEL. Confining the injected carriers to the fundamental lasing mode results in a uniform carrier density throughout this region and the elimination of a secondary optical signal. It should be noted that in this case, the VCSEL is said to operate in a single mode. If the current injection into the VCSEL also stimulates a higher order mode, the VCSEL is said to operate in multiple modes.

Figure 1:
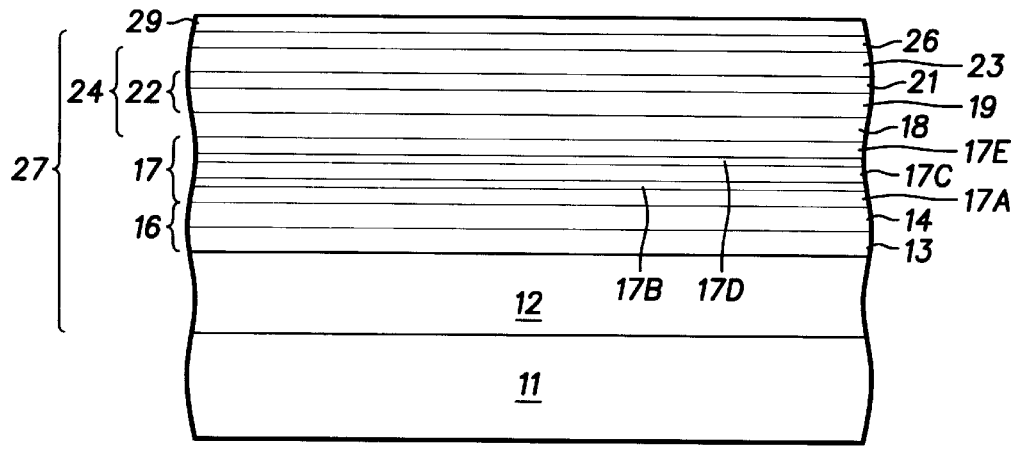
FIG. 1 illustrates a cross-sectional view of a portion of a VCSEL at a beginning stage of manufacture in accordance with a first embodiment of the present invention.

FIG. 1 is a cross-sectional view of a portion of a VCSEL 10 at a beginning stage of manufacture in accordance with a first embodiment of the present invention. VCSEL 10 includes a substrate 11 having top and bottom surfaces, wherein layers may be epitaxially grown on the top surface using, for example, Metal-Organic Vapor Phase Epitaxy (MOVPE), Molecular Beam Epitaxy (MBE), or the like. Suitable materials for substrate 11 include compound semiconductor materials such as, for example, III–V semiconductor materials, II–VI semiconductor materials, or the like. By way of example, substrate 11 is a semiconductor substrate comprised of gallium arsenide doped with an impurity material or dopant of N conductivity type such as silicon. It should be understood that the present embodiment will describe a VCSEL optimized for emitting light at a wavelength of approximately 850 nanometers (nm). However, the wavelength of the light being emitted from VCSEL 10 is not a limitation of the present invention.

A first ¼ wave stack 12 is formed on substrate 11. First ¼ wave stack 12 is also referred to as a mirror stack or a distributed Bragg reflector. A VCSEL is typically fabricated to operate at a particular wavelength, which is called the lasing wavelength or wavelength of operation. Preferably, the material used in the first ¼ wavelength stack is transparent at the lasing wavelength. In accordance with the first embodiment, mirror stack 12 is comprised of alternating layers of N-type aluminum gallium arsenide (AlGaAs) of different aluminum composition, e.g., $Al_{0.15}Ga_{0.85}As$ and $Al_{0.8}Ga_{0.2}As$. In addition, the thickness of each layer is preferably equal to ¼ of the wavelength of operation divided by the refractive index. The number of periods of pairs of alternating layers determines the reflectivity of the device. Typically, the number of periods ranges from 30 to 40.

A cladding or doped layer 13 having a thickness ranging between approximately 300 angstroms and approximately 500 angstroms is formed on mirror stack 12. A suitable material for cladding layer 13 is aluminum gallium arsenide (AlGaAs). By way of example cladding layer 13 is $Al_{0.5}Ga_{0.5}As$ doped with an impurity material of N conductivity type having a concentration of approximately $10^{18}$ atoms per centimeter cubed (atoms/cm³).

A confinement or undoped layer 14 having a thickness ranging between approximately 300 angstroms and approximately 500 angstroms is formed on cladding layer 13. Confinement layer 14 is also referred to as a Separate Confinement Heterostructure (SCH) or an undoped cladding layer. A suitable material for SCH cladding layer 14 will have a lower bandgap than that of cladding layer 13 and a higher bandgap than the quantum wells in an active region 17 disposed over SCH cladding layer 14. Unlike cladding layer 13, SCH cladding layer 14 is undoped. In accordance with cladding layer 13 being $Al_{0.5}Ga_{0.5}As$, SCH cladding layer 14 is $Al_{0.3}Ga_{0.7}As$. The mole fraction of aluminum in cladding layer 13 can range from approximately 0.2 to 0.7 and the mole fraction of aluminum in SCH cladding layer 14 can range from approximately 0.1 to approximately 0.5. Cladding layer 13 and SCH cladding layer 14 are collectively referred to as a cladding region 16. Because SCH cladding layer 14 is part of a cladding region having a cladding layer doped with an impurity material of N conductivity type, i.e., cladding layer 13, it is referred to as an N-side SCH cladding layer.

An active region 17 having a thickness ranging from approximately 100 angstroms to approximately 800 angstroms is formed on SCH cladding layer 14, i.e., active region 17 is formed on cladding region 16. Active region 17 is preferably comprised of a plurality of barrier layers and at least one quantum well layer. By way of example, active region 17 includes three quantum well layers 17A, 17C, and 17E separated by barrier layers 17B and 17D; wherein quantum well layers 17A, 17C, and 17E are comprised of GaAs having thicknesses of approximately 100 angstroms each, and barrier layers 17B and 17D are comprised of $Al_{0.3}Ga_{0.7}As$ having thicknesses of approximately 100 angstroms each. More particularly, quantum well layer 17A is formed on SCH cladding layer 14, barrier layer 17B is formed on quantum well layer 17A, quantum well layer 17C is formed on barrier layer 17B, barrier layer 17D is formed on quantum well layer 17C, and quantum well layer 17E is formed on barrier layer 17D. It should be understood that the number of quantum well layers and the number of barrier layers is not a limitation of the present invention. In other words, active region 17 can be comprised of one or more quantum well layers and zero or more barrier layers, depending on the application. As those skilled in the art are aware, other materials may be used for the quantum well layers and the barrier layers for different operating wavelengths, with appropriate changes to mirror stack 12 to maintain transparency. For a laser lasing at approximately 780 nanometers, another suitable material. for the quantum well regions is $Al_{0.1}Ga_{0.9}As$ and another suitable material for the barrier layer is $Al_{0.4}Ga_{0.6}As$.

An SCH cladding layer 18 having a thickness ranging between approximately 300 angstroms and approximately 500 angstroms is formed on active region 17. SCH cladding layer 18 is an undoped cladding layer. A suitable material for SCH cladding layer 18 has a wider bandgap than the quantum wells in active region 17 and a lower bandgap than that of a current spreading layer 19, which is disposed over SCH cladding layer 18. In accordance with the present embodiment, SCH cladding layer 18 is $Al_{0.3}Ga_{0.7}As$. For reasons that will become apparent, SCH cladding layer 18 is also referred to as a P-side SCH cladding layer 18. It should be understood the mole fraction of aluminum in SCH cladding layer 14 can range from approximately 0.1 to approximately 0.5.

A first current spreading layer 19 having a thickness ranging between approximately 300 angstroms and approximately 700 angstroms is formed on SCH cladding layer 18. In accordance with the present embodiment, current spreading layer 19 is undoped $Al_{0.5}Ga_{0.5}As$ having a thickness of approximately 500 angstroms. A second current spreading layer 21 having a thickness ranging between approximately 50 angstroms and approximately 400 angstroms is formed on current spreading layer 19. In accordance with the present embodiment, current spreading layer 21 is undoped $Al_{0.8}Ga_{0.2}As$ having a thickness of approximately 200 angstroms. Thus, current spreading layers 19 and 21 are undoped aluminum gallium arsenide. The mole fraction of aluminum in current spreading layer 19 can range from approximately 0.2 to 0.7 and the mole fraction of aluminum in current spreading layer 21 can range from approximately 0.4 to approximately 1.0. Preferably, there is a valence band discontinuity between current spreading layers 19 and 21, with current spreading layer 21 having a lower energy valence band edge than current spreading layer 19. Current spreading layers 19 and 21 cooperate to form a current spreading region 22. Although, VCSEL 10 is described as including a current spreading region, this is not a limitation of the present invention. For example, VCSEL 10 can be manufactured without a current spreading region.

A cladding or doped layer 23 having a thickness ranging between approximately 300 angstroms and approximately 1 micrometer is formed on current spreading layer 21. A suitable material for cladding layer 23 has a bandgap similar to that of current spreading layer 19 and a higher energy valence band edge than current spreading layer 21. In accordance with the present embodiment, cladding layer 23 is $Al_{0.5}Ga_{0.5}As$ doped with an impurity material of P conductivity type having a concentration of approximately $5\times10^{17}$ atoms/cm³. SCH cladding layer 18, current spreading region 22, and cladding layer 23 cooperate to form a cladding region 24. Because SCH cladding layer 18 is part of a cladding region having a cladding layer doped with an impurity material of P conductivity type, i.e., cladding layer 23, it is referred to as a P-side SCH cladding layer.

A contact layer 26 having a thickness ranging between approximately 50 angstroms and approximately 300 angstroms and a doping concentration ranging from approximately $1\times10^{18}$ atoms/cm³ to approximately $1\times10^{20}$ atoms/cm³ is formed on cladding layer 23. In accordance with the present embodiment, contact layer 26 has a thickness of 100 angstroms and is GaAs doped with an impurity material of P conductivity type having a dopant concentration greater than approximately $1\times10^{19}$ atoms/cm³.

Cladding layer 13, SCH cladding layer 14, active region 17, SCH cladding layer 18, current spreading layers 19 and 21, cladding layer 23, and contact layer 26 are referred to as an optical cavity 27 or merely a cavity 27. Preferably, the thickness of cavity 27 is at least one wavelength ($\lambda$) or a multiple of the wavelength of the light emitted from VCSEL 10. Further, the total thickness of cladding region 16 and half of active layer 17 is at least one-half ($\frac{1}{2}$) the wavelength or a multiple of the half wavelength ($N*\lambda/2$) of the light emitted from VCSEL 10, where N is an integer. Thus, it is preferable that the center of active region 17 be spaced apart from mirror stack 12 by a distance equal to a multiple of the half-wavelength of the light emitted from VCSEL 10. In accordance with the present embodiment, the total thickness of layers 13, 14, 17, 18, 19, 21, 23, and 26 is approximately 7,860 angstroms, i.e., three wavelengths at a wavelength of 850 nm, with layers 13, 14, and half of layer 17 being approximately 1,310 angstroms, i.e., half a wavelength at a wavelength of 850 nm.

A masking layer 29 is formed on contact layer 24. Preferably, masking layer 29 is formed from a material that prevents crystal re-growth such as, for example, silicon nitride $Si_3N_4$, silicon dioxide $SiO_2$, or the like. Masking materials that prevent crystal re-growth and techniques for forming the masking materials are well known to those skilled in the art.

Figure 2:
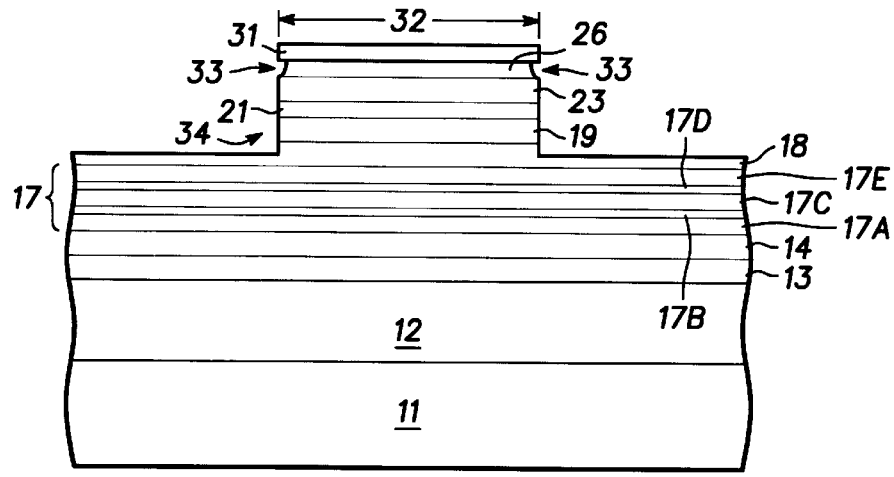
FIG. 2 illustrates a cross-sectional view of the VCSEL of FIG. 1 at a later stage of fabrication.

FIG. 2 illustrates a cross-sectional view of VCSEL 10 at a later stage of fabrication. It should be understood that the same reference numerals are used in the figures to denote the same elements. Using known techniques, masking layer 29 is etched so that only a portion 31 of masking layer 29 remains over contact layer 26. The width 32 of portion 31 is selected to ensure that VCSEL 10 operates in a single fundamental mode. The etching of masking layer 29 leaves regions of contact layer 26 exposed. The exposed regions of contact layer 26 and the portions of cladding layer 23, current spreading layers 21 and 19, and SCH cladding layer 18 underlying the exposed regions of contact layer 26 are etched using techniques well known to those skilled in the art to form a ridge structure 34. By way of example, ridge structure 34 has a width of less than approximately six micrometers. It is preferable for the corner positions of ridge structure 34 to be etched away to form an undercut portion 33. Thus, at least part of the etch process should be isotropic. The whole etch could either be an isotropic wet or dry etch or a combination of an anisotropic dry etch followed by a shallow isotropic wet or dry etch.

The etch is terminated before reaching active region 17. In other words, the etch is terminated before completely etching through SCH cladding layer 18. In accordance with the embodiment in which VCSEL 10 emits light having a wavelength of 850 nm, the thickness of the exposed portion of SCH cladding layer 18 is approximately 0.1 micrometers ($\mu$m). The thickness of the remaining portion of SCH cladding layer 18 is not a limitation of the present invention. Further, the etch can continue into active region 17.

Figure 3:
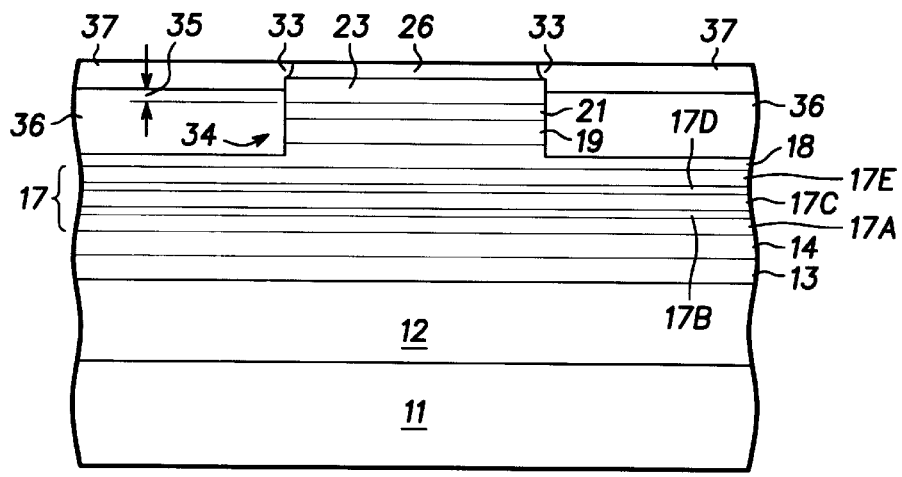
FIG. 3 illustrates a cross-sectional view of the VCSEL of FIG. 2 at a later stage of fabrication.

Now referring to FIG. 3, a confinement layer 36 is formed on the exposed portions of SCH cladding layer 18 adjacent to ridge structure 34. Preferably, confinement layer 36 extends to a height of approximately 0.1 $\mu$m above current spreading layer 21, i.e., the distance indicated by reference number 35. A suitable material for confinement layer 36 is AlGaAs or the like, either lightly doped with an impurity material having an opposite conductivity type as cladding layer 23 or doped with a material which creates a semi-insulating (high resistivity) material. In accordance with the present embodiment, confinement layer 36 is of N conductivity type.

Still referring to FIG. 3, another confinement layer 37 is formed on confinement layer 36 and adjacent portions of cladding layer 23 and contact layer 26. Preferably, confinement layer 37 fills undercut portion 33 and has a top surface that is contiguous with the top surface of contact layer 26. Preferably, confinement layer 37 is formed from a semiconductor material doped with an impurity material of the same conductivity type as cladding layer 23. In accordance with the present embodiment, confinement layer 37 is doped with an impurity material of P conductivity type. Confinement layers 36 and 37 are formed by an epitaxial growth method such as MOVPE or MBE. When lasing, the optical mode will penetrate into confinement layer 37. Portion 31 of mask layer 29 is removed using techniques well known to those skilled in the art.

Figure 4:
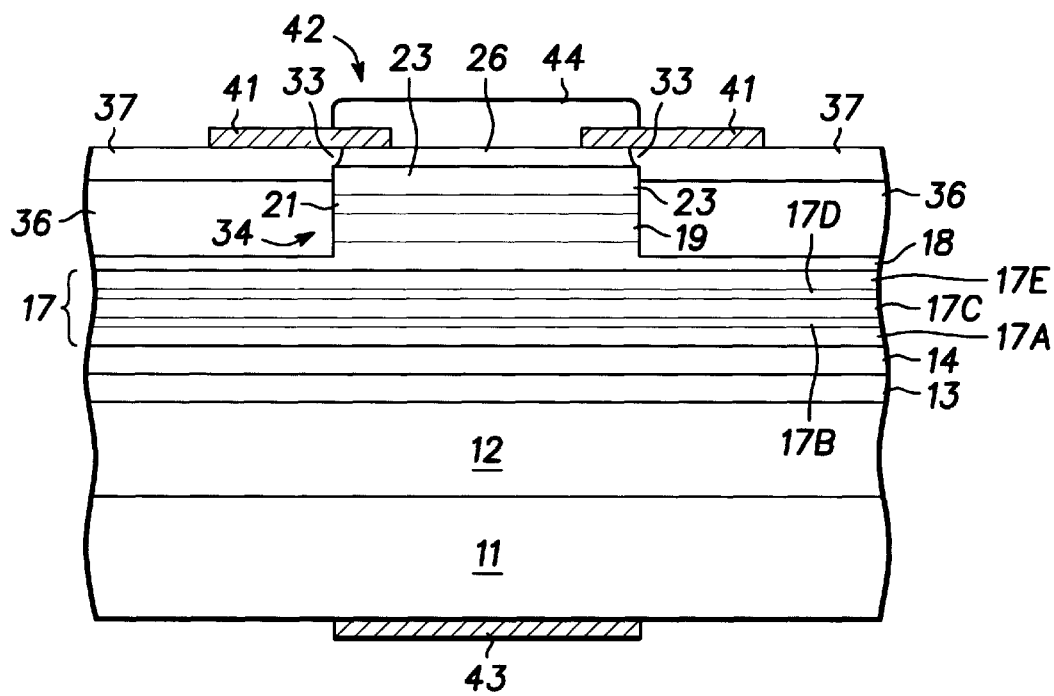
FIG. 4 illustrates a cross-sectional view of the VCSEL of FIG. 3 at a later stage of fabrication.

FIG. 4 illustrates a cross-sectional view of a portion of VCSEL 10 at an even later stage of fabrication. A contact 41 is formed on portions of confinement layer 37 and contact layer 26. Contact 41 has an opening 42 exposing a portion of contact layer 26. Light emitted by VCSEL 10 is transmitted through opening 42. Alternatively, contact 41 can be formed on portions of confinement layer 37 and be absent from contact layer 26. Suitable materials for contact 41 include titanium tungsten (TiW), chrome/gold zinc (Cr/AuZn), or the like.

An electrical contact 43 is formed on a lower surface of substrate 11. Preferably contact 43 is of N conductivity type. A metallization system for contact 43 is a germanium/nickel/gold (Ge/Ni/Au) metallization system. Alternatively, contact 43 can be formed on mirror stack 12.

A dielectric mirror 44 is formed over at least a portion of contact 41 and on a portion of contact layer 26 within opening 42. Suitable materials for dielectric mirror 44 include silicon dioxide, titanium dioxide, or the like. Preferably, the reflectivity of dielectric mirror 44 is approximately 99%.

In operation, lasing occurs by applying a voltage across contacts 41 and 43 to inject current or carriers into VCSEL 10. Contact layer 26 enhances the electrical contact between the current injection region of VCSEL 10 and contact 41. In accordance with the present invention, injected carriers are confined to the current injection region of VCSEL 10 by confinement layer 36. Current spreading region 22 spreads the injected current to create a uniform carrier distribution within the current injection region of VCSEL 10. By confining the injected carriers within a single optical mode, the injected carriers are forced into areas of VCSEL 10 that are lasing.

Figure 5:
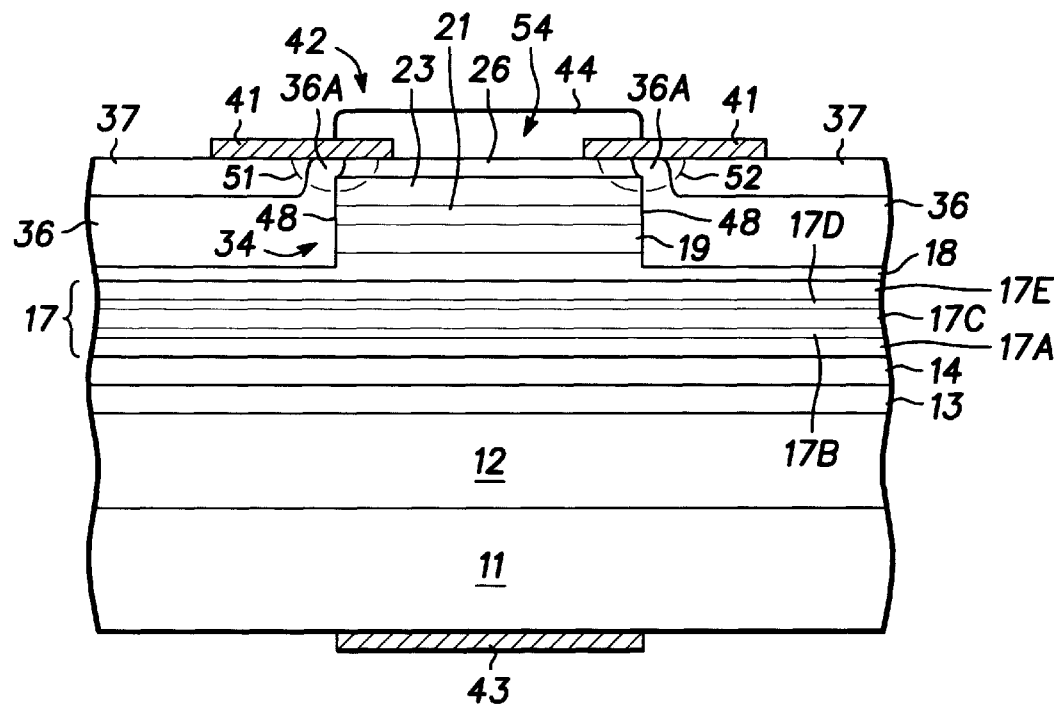
FIG. 5 illustrates a cross-sectional view of a VCSEL in accordance with a second embodiment of the present invention.

FIG. 5 is a cross-sectional view of a portion of a VCSEL 50 in accordance with a second embodiment of the present invention. It should be understood that the same reference numerals are used in the figures to denote the same elements. VCSEL 50 is similar to VCSEL 10 of FIG. 4 except that when confinement layer 36 is formed on the exposed portions of SCH cladding layer 18 adjacent to ridge structure 34, portions 36A extend to the top surface of contact layer 26 and along the sidewalls 48 of ridge structure 34. Like VCSEL 10, confinement layer 36 preferably extends to a height of approximately 0.1 $\mu$m above current spreading layer 21. A suitable material for confinement layer 36 is AlGaAs doped with an impurity material having an opposite conductivity type as cladding layer 21. In accordance with the present embodiment, confinement layer 36 is of N conductivity type. Alternatively, confinement layer 36 can be formed from a semi-insulating regrowth material.

Similar to VCSEL 10, VCSEL 50 includes another confinement layer 37 formed on confinement layer 36 and adjacent portions 36A. Thus, confinement layer 37 is laterally spaced apart from doped layer 23. Preferably, confinement layer 37 has a top surface that is contiguous with the top surface of contact layer 26 and is formed from a semiconductor material doped with an impurity material of the same conductivity type as cladding layer 23. In accordance with the present embodiment, confinement layer 37 is doped with an impurity material of P conductivity type.

Doped regions 51 and 52 are formed in portions 36A of confinement layer 36 as well as in the portions of confinement layer 37 and contact layer 26 adjacent portions 36A. In accordance with the second embodiment, doped regions 51 and 52 are formed by implanting or diffusing an impurity material of P conductivity type into confinement layers 36 and 37 and contact layer 26. By way of example, the P-type impurity material is implanted at a dose of approximately $1 \times 10^{13}$ atoms/centimeter squared (atoms/cm$^2$) and a implant energy of 30–50 kilo-electron Volts (keV). Doped regions 51 and 52 serve to ensure good electrical contact between confinement region 37 and layers 21 and 23.

A contact 41 is formed on portions of confinement layers 36 and 37 and on contact layer 26. Contact 41 has an opening 54 exposing a portion of contact layer 26. Light emitted by VCSEL 50 is transmitted through opening 54. Alternatively, contact 41 can be formed on portions of confinement layers 36 and 37 and be absent from contact layer 26. Suitable materials for contact 41 include TiW, Cr/AuZn, or the like.

Electrical contact 43 is formed adjacent mirror stack 12. By way of example, electrical contact 43 is formed on substrate 11. Preferably, electrical contact 43 is of N conductivity type. A suitable material for electrical contact 43 is Ge/Ni/Au. Although not shown, electrical contact 43 can be formed on mirror stack 12.

A dielectric mirror 44 is formed on a portion of contact 41 and on a portion of contact layer 26 within opening 54.

Suitable materials for dielectric mirror 44 include silicon dioxide, titanium dioxide, or the like. Preferably, the reflectivity of dielectric mirror 44 is approximately 99%.

By now it should be appreciated that a semiconductor laser device and method for manufacturing the semiconductor laser device have been provided. An advantage of present invention is that it provides a semiconductor laser device that confines injected carriers to the optically active region of the semiconductor laser device. Further, a semiconductor laser device of the present invention reduces undesirable secondary optical output pulses. Another advantage of the present invention is that it provides a method that is compatible with standard semiconductor processes and is cost efficient.

What is claimed is:

1. A semiconductor laser device, comprising:
   a first mirror stack of a first conductivity type;
   a first cladding region disposed on the first mirror stack;
   an active region disposed on the first cladding region;
   a second cladding region having an undoped layer, and a doped layer of a second conductivity type, the second cladding region disposed on the active region;
   a ridge structure formed from a portion of the second cladding region, wherein the ridge structure has a width selected to maintain laser operation in a fundamental mode;
   a second mirror stack disposed on a portion of the second cladding region;
   a first confinement layer of the first conductivity type adjacent a portion of the ridge structure;
   a second confinement layer overlying a portion of the first confinement layer, wherein the second confinement layer contacts the doped layer of the second cladding region.

2. A semiconductor laser device, comprising:
   a first mirror stack of a first conductivity type;
   a first cladding region disposed on the first mirror stack;
   an active region disposed on the first cladding region;
   a second cladding region having an undoped layer, and a doped layer of a second conductivity type, the second cladding region disposed on the active region;
   a ridge structure formed from a portion of the second cladding region, wherein the ridge structure has a width selected to maintain laser operation in a fundamental mode, a second mirror stack disposed on a portion of the second cladding region;
   a first confinement layer of the first conductivity type adjacent a portion of the ridge structure; and
   a second confinement layer overlying a portion of the first confinement layer, wherein the second confinement layer is laterally spaced apart from the doped layer of the second cladding region.

3. A semiconductor laser device, comprising:
   a first mirror stack of a first conductivity type;
   a first cladding region disposed on the first mirror stack;
   an active region disposed on the first cladding region;
   a second cladding region having an undoped layer, and a doped layer of a second conductivity type, the second cladding region disposed on the active region;
   a ridge structure formed from a portion of the second cladding region, wherein the ridge structure has a width selected to maintain laser operation in a fundamental mode; and
   a second mirror stack disposed on a portion of the second cladding region, wherein the second cladding region further includes a current spreading region disposed on the undoped layer of the second cladding region and wherein the doped layer of the second cladding region is disposed on the current spreading region.

4. The semiconductor laser device of claim 3, wherein the current spreading region includes a first current spreading layer disposed on a second current spreading layer.

5. The semiconductor laser device of claim 4, wherein the first and second current spreading layers are undoped aluminum gallium arsenide.

6. The semiconductor laser device of claim 5, wherein the first current spreading layer has an aluminum mole fraction ranging between approximately 0.2 and approximately 0.7 and the second current spreading layer has an aluminum mole fraction ranging between approximately 0.4 and approximately 1.0.

7. A Vertical Cavity Surface Emitting Laser (VCSEL), comprising:
   a substrate having a surface;
   a first mirror stack of a first conductivity type over the surface of the substrate;
   a first cladding region over the first mirror stack;
   an active region over the first cladding region, wherein a center of the active region is spaced apart from the first mirror stack by a distance equal to one half wavelength of light emitted by the VCSEL;
   a second cladding region over the active region;
   a ridge structure formed from a portion of the second cladding region, the ridge structure having an undoped portion and a doped portion; and
   a second mirror stack over a portion of the second cladding region.

8. The VCSEL of claim 7, wherein a distance between the first mirror stack and the second cladding region is equal to three wavelengths of light emitted by the VCSEL.

9. The VCSEL of claim 7, further including:
   a first contact formed on a second surface of the substrate; and
   a second contact formed on a portion of the second cladding region.

10. A semiconductor laser device, comprising:
    a substrate having a surface;
    a first distributed Bragg reflector disposed on the surface of the substrate;
    a first cladding region disposed on the first distributed Bragg reflector;
    an active region disposed on the first cladding region;
    a second cladding region disposed on the active region, wherein the second cladding region includes an undoped layer disposed on the active region and a doped layer of a first conductivity type over the undoped layer;
    a second distributed Bragg reflector disposed on a portion of the second cladding region;
    a first confinement layer adjacent a portion of the second cladding region, wherein the first confinement layer is doped with an impurity material of a second conductivity type; and
    a second confinement layer disposed on a portion of the first confinement layer.

11. A semiconductor laser device, comprising:
    a substrate having a surface;

a first distributed Bragg reflector disposed on the surface of the substrate;

a first cladding region disposed on the first distributed Bragg reflector;

an active region disposed on the first cladding region;

a second cladding region disposed on the active region, wherein the second cladding region includes an undoped layer disposed on the active region and a doped layer of a first conductivity type over the undoped layer;

a second distributed Bragg reflector disposed on a portion of the second cladding region;

a first confinement layer adjacent a portion of the second cladding region; and a second confinement layer disposed on a portion of the first confinement layer, wherein the second confinement layer is doped with an impurity material of the first conductivity type.

* * * * *

UNITED STATES PATENT AND TRADEMARK OFFICE
CERTIFICATE OF CORRECTION

PATENT NO.    : 6,160,830
DATED         : December 12, 2000
INVENTOR(S)   : Philip Anthony Kiely et al.

Page 1 of 1

It is certified that error appears in the above-identified patent and that said Letters Patent is hereby corrected as shown below:

Column 8, claim 10,
Line 56, change "undoned" to -- undoped --

Signed and Sealed this

Thirteenth Day of November, 2001

Attest:

NICHOLAS P. GODICI
Attesting Officer
Acting Director of the United States Patent and Trademark Office